(12) United States Patent
Kishida et al.

(10) Patent No.: US 6,746,962 B2
(45) Date of Patent: Jun. 8, 2004

(54) METHOD FOR FABRICATING A SEMI-CONDUCTOR DEVICE HAVING A TUNGSTEN FILM-FILLED VIA HOLE

(75) Inventors: Takenobu Kishida, Settsu (JP); Takeshi Harada, Takatsuki (JP); Toru Hinomura, Takatsuki (JP); Hiromitsu Abe, Kyoto (JP); Mitsunari Satake, Katano (JP); Kenichi Kunimitsu, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/978,723

(22) Filed: Oct. 18, 2001

(65) Prior Publication Data

US 2002/0050648 A1 May 2, 2002

(30) Foreign Application Priority Data

Oct. 26, 2000 (JP) ........................................ 2000-326604

(51) Int. Cl.$^7$ ...................... H01L 21/302; H01L 21/461
(52) U.S. Cl. .................................................... 438/705
(58) Field of Search ................................. 438/591, 573

(56) References Cited

U.S. PATENT DOCUMENTS

| 3,598,177 | A | * | 8/1971 | Webster ................. 165/104.26 |
| 5,221,449 | A | | 6/1993 | Colgan et al. |
| 5,281,485 | A | | 1/1994 | Colgan et al. |
| 5,420,072 | A | | 5/1995 | Fiordalice et al. |
| 5,609,511 | A | * | 3/1997 | Moriyama et al. .............. 451/5 |
| 5,795,817 | A | * | 8/1998 | Joo et al. .................... 438/591 |
| 6,001,461 | A | | 12/1999 | Toyoda et al. |
| 6,054,770 | A | | 4/2000 | Toyoda et al. |
| 6,063,703 | A | | 5/2000 | Shinriki et al. |
| 6,274,472 | B1 | * | 8/2001 | Hossain et al. ............. 438/598 |

FOREIGN PATENT DOCUMENTS

| JP | 06005604 A | 1/1994 |
| JP | 06112155 A | 4/1994 |
| JP | 08-139060 | 5/1996 |
| JP | 10064908 A | 4/1998 |
| JP | 10144626 A | 5/1998 |
| JP | 11186260 A | 7/1999 |
| JP | 2001-085430 | 3/2001 |
| WO | 99/13501 | 3/1999 |

OTHER PUBLICATIONS

J. A. Borders et al., "Modern Materials Analysis Techniques", Analytical Methods, an MRS Short Course, Materials Research Society, PA, 1986, pp. 54–55.*

European Search Report (Dated Apr. 3, 2003).

* cited by examiner

Primary Examiner—W. David Coleman
(74) Attorney, Agent, or Firm—Nixon Peabody LLP; Donald R. Studebaker

(57) ABSTRACT

A first metal film is deposited on a bottom and a wall of a recess formed in an insulating film on a semiconductor substrate. A second metal film is filled in the recess on the first metal film. The second metal film is formed from a polycrystalline tungsten film having a crystal plane of a (110) orientation.

10 Claims, 5 Drawing Sheets

METHOD FOR FABRICATING A SEMI-CONDUCTOR DEVICE HAVING A TUNGSTEN FILM-FILLED VIA HOLE

BACKGROUND OF THE INVENTION

The present invention relates to a semiconductor device and a method for fabricating the same, and more particularly, it relates to a technique to form a plug by filling a contact hole or a via hole with a tungsten film.

Conventionally, a plug of tungsten (tungsten plug) is used for connection between a lower interconnect and an upper interconnect in a semiconductor integrated circuit. A tungsten plug is formed as follows: An adhesion layer of a titanium film or a titanium nitride film is deposited on an interlayer insulating film and on a bottom and a wall of a via hole formed in the interlayer insulating film, a tungsten film is deposited on the adhesion layer by CVD, and thereafter, excessive portions of the adhesion layer and the tungsten film present on the interlayer insulating film are removed by CMP (chemical mechanical polishing).

In forming a tungsten plug, it is particularly significant how accurately a CMP end point is controlled in removing the portions of the adhesion layer and the tungsten film present on the interlayer insulating film by the CMP.

In the case where the CMP end point of the tungsten film cannot be accurately detected, the tungsten film is excessively polished so as to largely increase the contact resistance of the tungsten plug or the tungsten film is insufficiently polished so as to cause short-circuit between adjacent tungsten plugs.

Therefore, for example, Japanese Laid-Open Patent Publication No. 8-139060 discloses a method for detecting an end point in polishing a metal film such as a tungsten film by the CMP. In this end point detecting method, an end point is detected as a time point at which the rotating torque of a substrate holder or a turn table is changed when an interlayer insulating film is exposed through the polishing of an adhesion layer and a metal film.

In the conventional CMP, however, the time point at which the interlayer insulating film is exposed is regarded as the polishing end point, excessive polishing can be easily caused.

Therefore, the following method has been proposed: A polishing end point of a tungsten film is detected by detecting the change of the rotating torque of a substrate holder or a turn table when a film polished by the CMP is changed from the tungsten film to the adhesion layer. Thereafter, time required for polishing the adhesion layer (polishing time) is calculated based on the thickness and the polishing rate of the adhesion layer, so that a time point when the polishing time of the adhesion layer has elapsed can be detected as the CMP end point.

However, there still arises a problem that the CMP end point of the tungsten film cannot be accurately detected.

FIGS. 8A and 8B show the relationship between time and rotating torque in the CMP carried out on an adhesion layer deposited by the CVD and a tungsten film deposited by the CVD on the adhesion layer. In the case of FIG. 8A, the rotating torque is abruptly increased, and hence, the change of the polished film from the tungsten film to the adhesion layer can be definitely detected. In contrast, in the case of FIG. 8B, the change of the rotating torque is too small to definitely detect the change of the polished film from the tungsten film to the adhesion layer, namely, the CMP end point of the tungsten film.

When the CMP end point of the tungsten film cannot be definitely detected, the amount of tungsten film to be polished is largely varied, so that the tungsten film can be insufficiently polished or a recess can be formed in the tungsten film.

SUMMARY OF THE INVENTION

In consideration of the aforementioned conventional problems, an object of the invention is, in CMP of a multi-layer film composed of a first metal film deposited on an insulating film and on a bottom and a wall of a recess formed in the insulating film and a second metal film deposited on the first metal film, accurately detecting a CMP end point of the second metal film.

In order to achieve the object, the semiconductor device of this invention comprises a first metal film deposited on a bottom and a wall of a recess formed in an insulating film on a semiconductor substrate; and a second metal film filled in the recess on the first metal film, and the second metal film is formed from a polycrystalline tungsten film having a crystal plane of a (110) orientation.

In the semiconductor device of this invention, since the second metal film is formed from the polycrystalline tungsten film having a crystal plane of a (110) orientation, a CMP end point of the second metal film can be accurately detected in carrying out the CMP on the second metal film and the first metal film. Accordingly, excessive polishing and insufficient polishing can be avoided in the CMP.

In the semiconductor device, the crystal plane of the second metal film is preferably oriented with a half-value width of 4 degrees or less.

Thus, the CMP end point of the second metal film can be more accurately detected.

In the semiconductor device, the first metal film preferably includes a titanium film having a crystal plane of a (0002) orientation with a half-value width of 4 degrees or less.

Thus, the crystal orientation of the tungsten film serving as the second metal film can be definitely improved, and hence, the CMP end point of the second metal film can be more accurately detected.

In the semiconductor device, the first metal film preferably includes a lower titanium film and an upper titanium nitride film, and the lower titanium film preferably has a thickness of 10 nm or more.

Thus, the crystal orientation of the upper titanium nitride film can be improved, and therefore, the crystal orientation of the tungsten film serving as the second metal film can be definitely improved. As a result, the CMP end point of the second metal film can be more accurately detected.

In the semiconductor device, the first metal film preferably includes a lower titanium film and an upper titanium nitride film, and the upper titanium nitride film is preferably formed from a multi-layer film including a plurality of titanium nitride films each with a thickness of 4 nm or less.

Thus, the crystal orientation of the tungsten film serving as the second metal film and formed on the upper titanium nitride film can be definitely improved. Accordingly, the CMP end point of the second metal film can be more accurately improved.

In the semiconductor device, the first metal film preferably includes a titanium nitride film that is found, through a 2θ method using an in-plane X-ray diffractometer, to have a crystal plane of a (220) orientation with a half-value width of 2 degrees or less.

Thus, the crystal orientation of the tungsten film serving as the second metal film can be definitely improved, and hence, the CMP end point of the second metal film can be more accurately detected.

In this case, the titanium nitride film preferably includes carbon in a concentration of 5 wt % or less.

Thus, the crystal orientation of the tungsten film serving as the second metal film can be more definitely improved, and hence, the CMP end point of the second metal film can be more accurately detected.

Also in this case, the titanium nitride film is preferably formed by CVD using an organic titanium material.

Thus, the crystal orientation of the tungsten film serving as the second metal film can be more definitely improved, and hence, the CMP end point of the second metal film can be more accurately detected.

The method for fabricating a semiconductor device of this invention comprises the steps of depositing a first metal film on an insulating film formed on a semiconductor substrate and a bottom and a wall of a recess formed in the insulating film; filling a second metal film in the recess on the first metal film; and removing portions of the second metal film and the first metal film present on the insulating film by CMP, and the second metal film is formed from a polycrystalline tungsten film having a crystal plane of a (110) orientation.

In the method for fabricating a semiconductor device of this invention, since the second metal film is formed from the polycrystalline tungsten film having a crystal plane of a (110) orientation, a CMP end point of the second metal film can be accurately detected in carrying out the CMP on the second metal film and the first metal film. Accordingly, excessive polishing and insufficient polishing can be avoided in the CMP. in the method for fabricating a semiconductor device, the crystal plane of the second metal film is preferably oriented with a half-value width of 4 degrees or less.

Thus, the CMP end point of the second metal film can be more accurately detected.

In the method for fabricating a semiconductor device, the first metal film preferably includes a titanium film having a crystal plane of a (0002) orientation with a half-value width of 4 degrees or less.

Thus, the crystal orientation of the tungsten film serving as the second metal film can be definitely improved, and hence, the CMP end point of the second metal film can be more accurately detected.

In the method for fabricating a semiconductor device, the first metal film preferably includes a lower titanium film and an upper titanium nitride film, and the lower titanium film preferably has a thickness of 10 nm or more.

Thus, the crystal orientation of the upper titanium nitride film can be improved, and therefore, the crystal orientation of the tungsten film serving as the second metal film can be definitely improved. As a result, the CMP end point of the second metal film can be more accurately detected.

In the method for fabricating a semiconductor device, the first metal film preferably includes a lower titanium film and an upper titanium nitride film, and the upper titanium nitride film is preferably formed from a multi-layer film including a plurality of titanium nitride films each with a thickness of 4 nm or less.

Thus, the crystal orientation of the tungsten film serving as the second metal film and formed on the upper titanium nitride film can be definitely improved, and hence, the CMP end point of the second metal film can be more accurately detected.

In the method for fabricating a semiconductor device, the first metal film preferably includes a titanium nitride film that is found, through a 2θ method using an in-plane X-ray diffractometer, to have a crystal plane of a (220) orientation with a half-value width of 2 degrees or less.

Thus, the crystal orientation of the tungsten film serving as the second metal film can be definitely improved, and hence, the CMP end point of the second metal film can be more accurately detected.

In this case, the titanium nitride film preferably includes carbon in a concentration of 5 wt % or less.

Thus, the crystal orientation of the tungsten film serving as the second metal film can be more definitely improved, and hence, the CMP end point of the second metal film can be more accurately detected.

Also in this case, the titanium nitride film is preferably formed by CVD using an organic titanium material.

Thus, the crystal orientation of the tungsten film serving as the second metal film can be more definitely improved, and hence, the CMP end point of the second metal film can be more accurately detected.

DETAILED DESCRIPTION OF THE INVENTION

Embodiment 1

A semiconductor device and a method for fabricating the same according to Embodiment 1 of the invention will now be described with reference to FIGS. 1A through 1D and 2A through 2C.

Figure 1A:
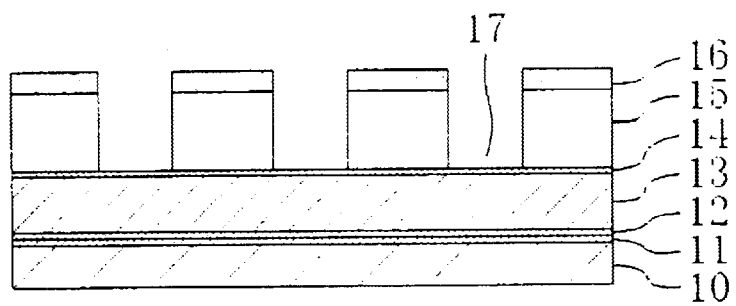
FIGS. 1A, 1B, 1C and 1D are cross-sectional views for showing procedures in a method for fabricating a semiconductor device according to Embodiment 1, 2 or 3 of the invention.

First, as shown in FIG. 1A, a lower metal interconnect composed of a first titanium film 11, a first titanium nitride film 12, a first aluminum film 13 and a second titanium nitride film 14 is formed on a semiconductor substrate 10. Thereafter, an interlayer insulating film 15 of a non-doped silicon oxide ($SiO_2$) film or a fluorine-doped silicon oxide (SiOF) film is formed over the semiconductor substrate 10 including the lower metal interconnect.

Next, a silicon oxide nitrided film 16 serving as a hard mask is formed on the interlayer insulating film 15 by plasma CVD, and then, the interlayer insulating film 15 is selectively etched by using the silicon oxide nitrided film 16 as a mask, thereby forming via holes 17 in the interlayer insulating film 15. The first titanium film 11 and the first titanium nitride film 12 serve as an adhesion layer and the second titanium nitride film 14 serves as an anti-reflection film in forming the via holes 17. The silicon oxide nitrided film 16 not only serves as the hard mask but also functions as an adhesion layer between the interlayer insulating film 15 and an upper metal interconnect formed later.

In forming the via holes 17 in the interlayer insulating film 15, in the case where the etch selectivity between the silicon oxide film used for forming the interlayer insulating film 15 and the silicon oxide nitrided film 16 used as the hard mask is not sufficiently high, the face of the silicon oxide nitrided film 16 may be roughened. When the silicon oxide nitrided film 16 has a rough face, there is a fear of degradation of crystal orientation of a second titanium film 18 (shown in FIG. 1C), a third titanium nitride film 19 (shown in FIG. 1D) and a tungsten film 20 (shown in FIG. 2A) deposited in subsequent procedures.

Figure 1B:
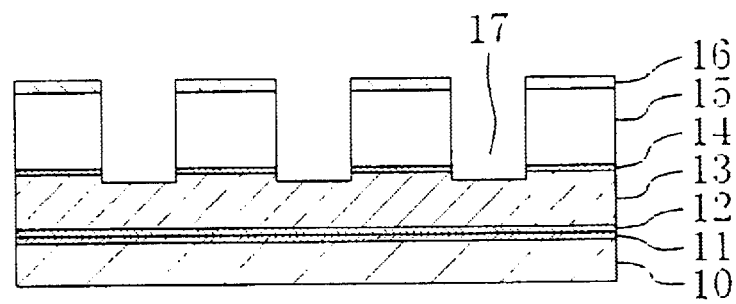

Therefore, the surface morphology of the silicon oxide nitrided film 16 is improved by subjecting the silicon oxide nitrided film 16 to sputtering etching using argon to an extent corresponding to a thickness of 10 nm or more on the basis of a thermally oxidized film. Thus, the bottoms of the via holes 17 are also etched, and hence, the bottoms of the via holes 17 are lowered to a level corresponding to a surface portion of the first aluminum film 13 as shown in FIG. 1B.

Figure 1C:
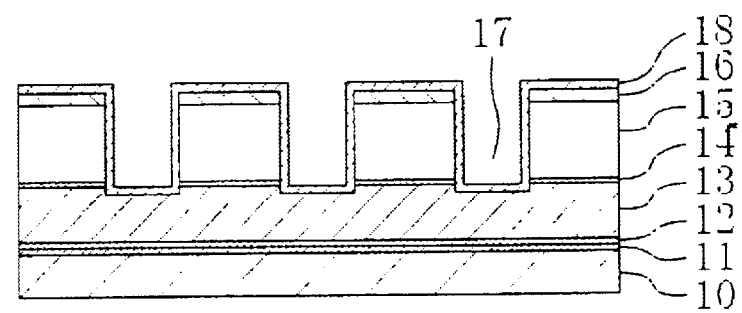

Next, as shown in FIG. 1C, the second titanium film 18 with a thickness of 10 nm or more is deposited on the bottoms and walls of the via holes 17 and on the interlayer insulating film 15 by highly directive sputtering such as ionized sputtering, colimated sputtering or long throw sputtering. In this manner, the second titanium film 18 can attain not only improved crystal orientation in the (0002) plane, that is, the close-packed crystal orientation plane, but also a half-value width of orientation strength of 4 degrees or less. In the second titanium film 18, the interatomic distance between closest atoms is approximately 2.95 Å.

Figure 1D:
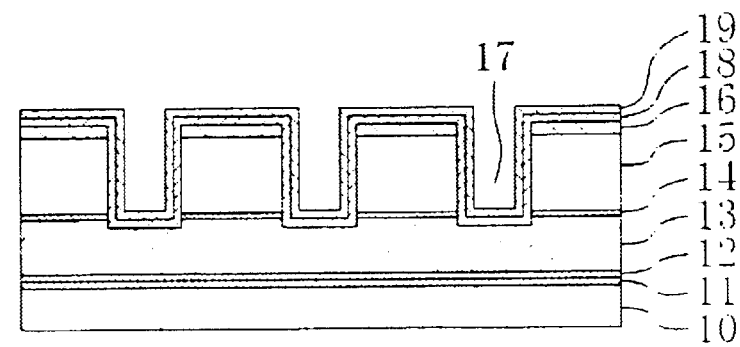

Then, as shown in FIG. 1D, the third titanium nitride film 19 is deposited on the second titanium film 18 by conducting LPCVD using TDMAT (tetrakis dimethyl amino titanium) as a material plural times.

The deposition of the third titanium nitride film 19 includes a first step of forming a TiCN film including carbon (C) through thermal decomposition of the TDMAT, and a second step of removing the carbon from the TiCN film through plasma processing in a nitrogen and hydrogen atmosphere. By repeatedly carrying out the first and second steps, the thickness of the resultant film is gradually increased until a desired thickness is obtained.

In the first step, a flow rate of the TDMAT is set to 250 ml/min. (in the normal condition), the surface temperature of the substrate is set to approximately 450° C. and the growth time is set to 9 seconds. In the second step, the pressure of a chamber used in the plasma processing is set to 173.3 Pa, the bias power applied to the substrate is set to 800 W and the plasma processing time is set to 50 seconds. In this case, the absolute value of the acceleration voltage of RF plasma is 30 V or more.

Since one cycle of this LPCVD results in forming a titanium nitride film with a thickness of approximately 5.0 nm, the LPCVD is carried out by two cycles in Embodiment 1, so as to form the third titanium nitride film 19 with a thickness of approximately 10.0 nm.

Since the second titanium film 18 has improved crystal orientation in the (0002) plane, that is, the close-packed crystal orientation plane, and has the half-value width of the orientation strength of 4 degrees or less, the crystal orientation of the third titanium nitride film 19 deposited on the second titanium film 18 can be improved. Specifically, in a $2\theta$ method using an in-plane X-ray diffractometer for measuring an orientation plane vertical to the substrate surface, it is found that the third titanium nitride film 19 has improved crystal orientation in the (220) plane and has a half-value width of the orientation strength of 2 degrees or less.

Figure 2A:
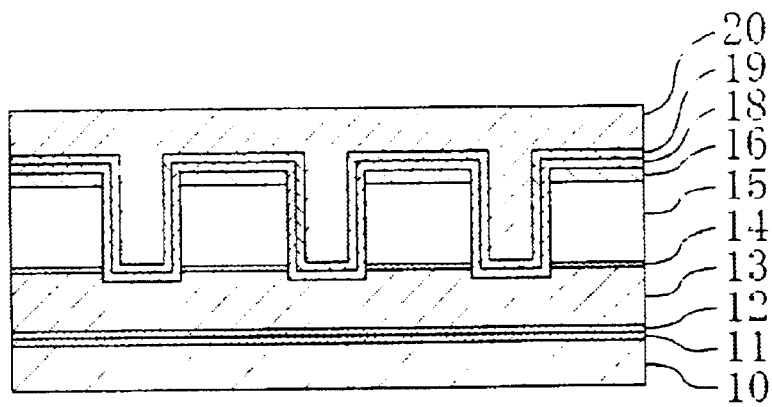
FIGS. 2A, 2B and 2C are cross-sectional views for showing other procedures in the method for fabricating a semiconductor device of Embodiment 1, 2 or 3.

Next, as shown in FIG. 2A, the tungsten film 20 is deposited on the third titanium nitride film 19 by the CVD. The deposition of the tungsten film 20 includes a first step and a second step. In the first step, a nucleus of a tungsten film is formed by reducing $WF_6$ with $SiH_4$, and in the second step, the tungsten film 20 is filled in the via holes 17 by reducing $WF_6$ with $H_2$.

Since the third titanium nitride film 19 has the improved crystal orientation, the orientation of the (110) plane, that is, the close-packed crystal orientation plane, of the tungsten film 20 deposited on the third titanium nitride film 19 is improved. Through the generally employed rocking curve measurement of X-ray diffraction, the half-value value width of the orientation strength is found to be 4 degrees or less.

Figure 2B:
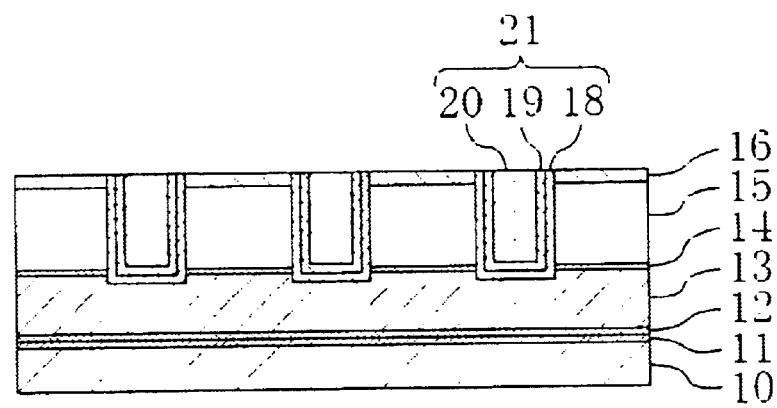

Then, as shown in FIG. 2B, the tungsten film 20, the third titanium nitride film 19 and the second titanium film 18 are subjected to the CMP, so as to remove portions of these films present on and above the silicon oxide nitrided film 16. Thus, a plug 21 composed of the tungsten film 20, the third titanium nitride film 19 and the second titanium film 18 is formed in each of the via holes 17.

Figure 2C:
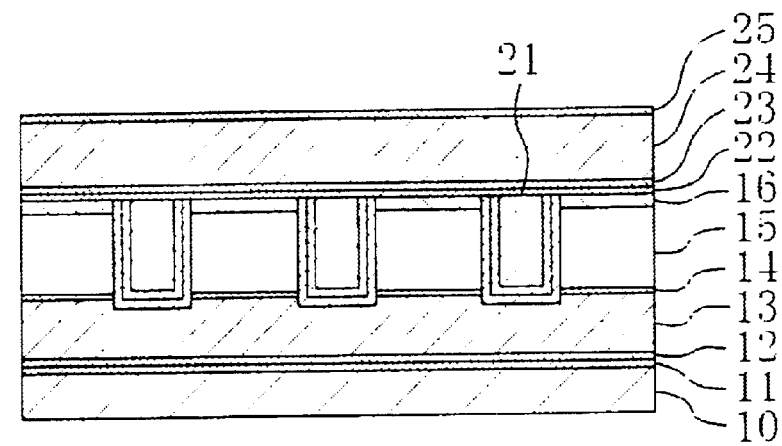

Subsequently, as shown in FIG. 2C, an upper metal interconnect composed of a third titanium film 22, a fourth titanium nitride film 23, a second aluminum film 24 and a fifth titanium nitride film 25 is formed on the plugs 21 and the silicon oxide nitrided film 16.

In Embodiment 1, since the second titanium film 18 with a thickness of 10 nm or more is deposited by the highly directive sputtering, the second titanium film 18 attains the improved crystal orientation in the (0002) plane, that is, the close-packed crystal orientation plane, and the half-value width of the orientation strength of 4 degrees or less. Therefore, the crystal orientation of the third titanium nitride film 19 deposited on the second titanium film 18 can be improved, and hence, the crystal orientation of the (110)

plane, that is, the close-packed crystal orientation plane, of the tungsten film 20 deposited on the third titanium nitride film 19 can be improved.

Figure 3:
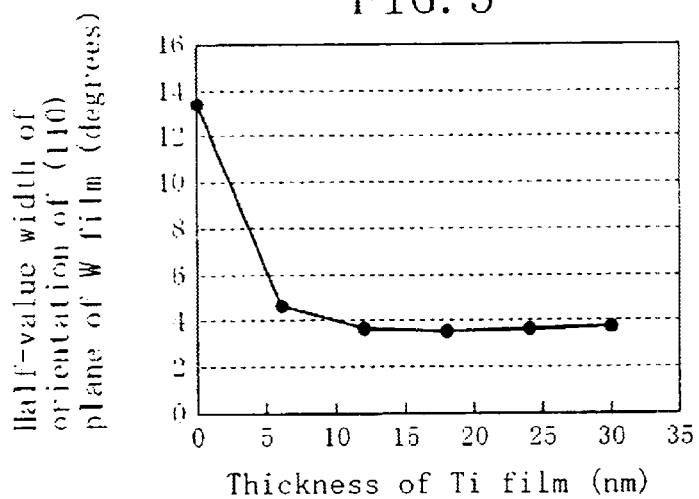
FIG. 3 is a characteristic diagram for showing the relationship between the thickness of a second titanium film deposited by highly directive sputtering and a half-value width of orientation strength of the (110) plane of a tungsten film in the method for fabricating a semiconductor device of Embodiment 1.

FIG. 3 shows the relationship between the thickness of the second titanium film 18 deposited by the highly directive sputtering and the half-value width of the orientation strength of the (110) plane of the tungsten film 20. It is understood from this graph that the half-value width of the orientation strength of the (110) plane of the tungsten film 20 is 4 degrees or less when the thickness of the second titanium film 18 is 10 nm or more.

Accordingly, the CMP end point of the tungsten film 20 can be accurately detected, so that the CMP end point of the third titanium nitride film 19 and the second titanium film 18 serving as the adhesion layer can be accurately detected. As a result, excessive polishing and insufficient polishing can be avoided.

In the case where the interlayer insulating film 15 is made from a SiOF film, when the silicon oxide nitrided film 16 has a thickness of 100 nm or less after the CMP of the tungsten film 20 and the adhesion layer, free fluorine included in the interlayer insulating film 15 is piled up in the upper metal interconnect. As a result, the upper metal interconnect can be easily peeled off from the interlayer insulating film 15.

However, since the CMP end point can be accurately detected in Embodiment 1 so as to avoid excessive polishing, the thickness of the silicon oxide nitrided film 16 can be adjusted to 100 nm or more. Accordingly, the upper metal interconnect can be definitely prevented from peeling off from the interlayer insulating film 15.

Embodiment 2

A semiconductor device and a method for fabricating the same according to Embodiment 2 of the invention will now be described with reference to FIGS. 1A through 1D and 2A through 2C.

In the same manner as in Embodiment 1, a lower metal interconnect composed of a first titanium film 11, a first titanium nitride film 12, a first aluminum film 13 and a second titanium nitride film 14 is formed on a semiconductor substrate 10, and thereafter, an interlayer insulating film 15 is formed over the semiconductor substrate 10 as shown in FIG. 1A. Subsequently, after forming a silicon oxide nitrided film 16 on the interlayer insulating film 15, the interlayer insulating film 15 is selectively etched by using the silicon oxide nitrided film 16 as a mask, thereby forming via holes 17 in the interlayer insulating film 15.

Next, as shown in FIG. 1B, the silicon oxide nitrided film 16 is subjected to the sputtering etching using argon so as to improve the surface morphology thereof. Then, as shown in FIG. 1C, a second titanium film 18 with a thickness of approximately 5 nm is deposited on the bottoms and walls of the via holes 17 and on the interlayer insulating film 15 by the highly directive sputtering.

Subsequently, as shown in FIG. 1D, the LPCVD using TDMAT as a material is carried out plural times, so as to deposit a third titanium nitride film 19 on the second titanium film 18.

The deposition of the third titanium nitride film 19 includes a first step of forming a TiCN film including carbon (C) through thermal decomposition of the TDMAT, and a second step of removing the carbon from the TiCN film through the plasma processing in a nitrogen and hydrogen atmosphere. By repeatedly carrying out the first and second steps, the thickness of the resultant film is gradually increased until a desired thickness is obtained.

In the first step, a flow rate of the TDMAT is set to 250 ml/min. (in the normal condition), the surface temperature of the substrate is set to approximately 400° C. and the growth time is set to 7 seconds. Since the surface temperature of the substrate is slightly lower and the growth time is slightly shorter than in the conventional technique and Embodiment 1, the thickness of the TiCN film grown in the first step is approximately 3.5 nm, which is smaller than the thickness attained in the conventional technique and Embodiment 1 (namely, approximately 5.0 nm). Therefore, the efficiency in extracting the carbon from the TiCN film in the second step can be improved. Specifically, since the thickness of the TiCN film grown in the first step is approximately 3.5 nm, the carbon can be efficiently extracted from the TiCN film in the second step, so as to improve the crystal orientation of the titanium nitride film. In the second step, the pressure in a chamber used in the plasma processing is set to 173.3 Pa, the bias power applied to the substrate is set to 800 W and the plasma processing time is set to 50 seconds. In this case, the bias power applied to the substrate is larger and the plasma processing time is longer than in the conventional technique, so as to reduce the amount of carbon remaining in the titanium nitride film.

When the first and second steps are carried out under the conventional conditions, the content of remaining carbon in the TiCN film is approximately 10% and the titanium nitride film is slightly oriented to the (111) plane, that is, the close-packed crystal orientation plane. In contrast, when the first and second steps are carried out under the conditions of Embodiment 2, the content of residual carbon in the TiCN film can be reduced to approximately 5% or less and the crystal orientation of the titanium nitride film can be improved. Specifically, it is found, through the 2θ method using an in-plane X-ray diffractometer, that the crystal plane of the titanium nitride film has a (220) orientation and that the half-value width of the orientation strength is 2 degrees or less.

One cycle of the LPCVD results in forming a titanium nitride film with a thickness of approximately 3.5 nm. Therefore, in Embodiment 2, the LPCVD is carried out by 2 cycles, so as to form the third titanium nitride film 19 with a thickness of approximately 7.0 nm.

Although the thickness of the TiCN film grown in the first step is approximately 3.5 nm in Embodiment 2, the carbon can be efficiently extracted from the TiCN film in the second step as far as the TiCN film has a thickness of 4.0 nm or less.

Since the third titanium nitride film 19 is deposited under the aforementioned conditions in Embodiment 2, the crystal orientation of the third titanium nitride film 19 can be improved. In addition, the interatomic distance between closest atoms of the second titanium film 18 highly orientated to the (0002) plane (that is, 2.95 Å) is very close to the interatomic distance between closest atoms of the (111) plane of the third titanium nitride film 19 (that is, 2.99 Å). Therefore, the crystal orientation of the third titanium nitride film 19 can be further improved.

Next, as shown in FIG. 2A, a tungsten film 20 is deposited on the third titanium nitride film 19 by the CVD. The deposition of the tungsten film 20 includes a first step and a second step. In the first step, a nucleus of a tungsten film is formed by reducing $WF_6$ with $SiH_4$, and in the second step, the tungsten film 20 is filled in the via holes 17 by reducing $WF_6$ with $H_2$.

Since the crystal orientation of the third titanium nitride film 19 is improved, the crystal orientation of the (110) plane, that is, the close-packed crystal orientation plane, of the tungsten film 20 deposited on the third titanium nitride film 19 can be improved. The half-value width of the orientation strength is found to be 4 degrees or less through the generally employed rocking curve measurement of the X-ray diffraction.

Then, as shown in FIG. 2B, the tungsten film 20, the third titanium nitride film 19 and the second titanium film 18 are subjected to the CMP, so as to remove portions of these films present on and above the silicon oxide nitrided film 16.

Subsequently, as shown in FIG. 2C, an upper metal interconnect composed of a third titanium film 22, a fourth titanium nitride film 23, a second aluminum film 24 and a fifth titanium nitride film 25 is formed on plugs 21 and the silicon oxide nitrided film 16.

In Embodiment 2, the third titanium film 19 is deposited by stacking a plurality of, for example, two layers of a titanium nitride film with a thickness of 4.0 nm or less deposited by the LPCVD. Therefore, the crystal orientation of the third titanium nitride film 19 can be improved and the half-value width of the orientation strength is 4 degrees or less. Accordingly, the crystal orientation of the (110) plane, that is, the close-packed crystal orientation plane, of the tungsten film 20 deposited on the third titanium film 19 can be improved.

Figure 4:
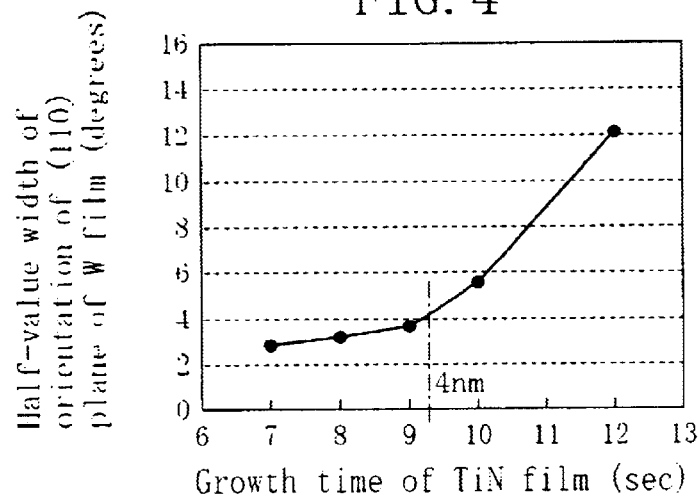
FIG. 4 is a characteristic diagram for showing the relationship between the thickness of a titanium nitride film grown in one cycle for forming a third titanium nitride film and a half-value width of orientation strength of the (110) plane of a tungsten film in the method for fabricating a semiconductor device of Embodiment 2.

FIG. 4 shows the relationship between the thickness of a titanium nitride film grown in one cycle for forming the third titanium nitride film and the half-value width of the orientation strength of the (110) plane of the tungsten film 20. It is understood from this graph that the half-value width of the orientation strength of the (110) plane of the tungsten film 20 is 4 degrees or less when the thickness of the titanium nitride film grown in one cycle is 4 nm or less.

Figure 5:
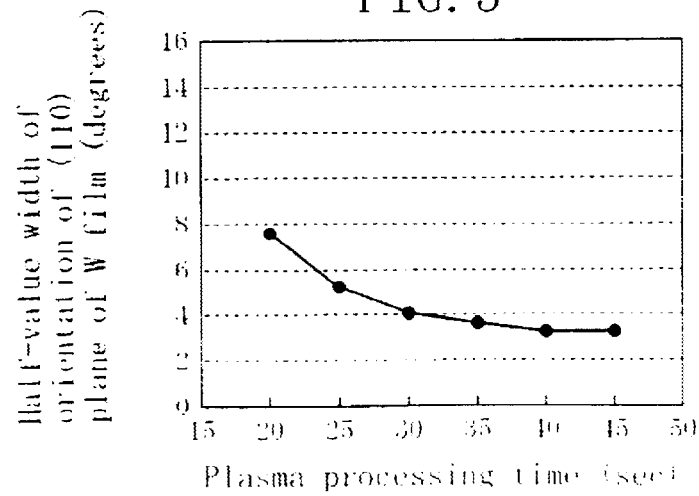
FIG. 5 is a characteristic diagram for showing the relationship between plasma processing time carried out on a titanium nitride film grown in one cycle for forming the third titanium nitride film and a half-value width of orientation strength of the (110) plane of a tungsten film in the method for fabricating a semiconductor device of Embodiment 2.

FIG. 5 shows the relationship between the plasma processing time for the titanium nitride film grown in one cycle for forming the third titanium nitride film and the half-value width of the orientation strength of the (110) plane of the tungsten film 20.

Accordingly, the CMP end point of the tungsten film 20 can be accurately detected, and hence, the CMP end point of the third titanium nitride film 19 and the second titanium film 18 serving as the adhesion layer can be accurately detected. As a result, excessive polishing and insufficient polishing can be avoided.

Embodiment 3

A semiconductor device and a method for fabricating the same according to Embodiment 3 of the invention will now be described with reference to FIGS. 1A through 1D and 2A through 2C.

In the same manner as in Embodiment 1, a lower metal interconnect composed of a first titanium film 11, a first titanium nitride film 12, a first aluminum film 13 and a second titanium nitride film 14 is formed on a semiconductor substrate 10, and then, an interlayer insulating film 15 is formed over the semiconductor substrate 10 as shown in FIG. 1A. Subsequently, a silicon oxide nitrided film 16 is formed on the interlayer insulating film 15, and the interlayer insulating film 15 is selectively etched by using the silicon oxide nitrided film 16 as a mask, thereby forming via holes 17 in the interlayer insulating film 15.

Next, as shown in FIG. 1B, the silicon oxide nitrided film 16 is subjected to the sputtering etching using argon, so as to improve the surface morphology thereof. Then, as shown in FIG. 1C, a second titanium film 18 with a thickness of approximately 5 nm is deposited on the bottoms and walls of the via holes 17 and on the interlayer insulating film 15 by the highly directive sputtering.

Then, as shown in FIG. 1D, the LPCVD using TDMAT as a material is carried out a plurality of times, thereby depositing a third titanium nitride film 19 on the second titanium film 18.

The deposition of the third titanium nitride film 19 includes, similarly to that of Embodiment 1, a first step of forming a TiCN film including carbon (C) through the thermal decomposition of the TDMAT and a second step of removing the carbon from the TiCN film through the plasma processing in a nitrogen and hydrogen atmosphere. By repeatedly carrying out the first and second steps, the third titanium nitride film 19 is formed in a thickness of approximately 10.0 nm.

Next, as shown in FIG. 2A, a tungsten film 20 is deposited on the third titanium nitride film 19.

The deposition of the tungsten film 20 includes a first step and a second step. In the first step, a nucleus of a tungsten film is formed by reducing $WF_6$ with $SiH_4$. In the first step, a flow rate of the $WF_6$ gas is set to 40 ml/min. (in the normal condition), a flow rate of the $SiH_4$ gas is set to 30 ml/min. (in the normal condition), the surface temperature of the substrate is set to approximately 400° C., the growth time is set to 20 seconds, and the $WF_6$ gas is introduced prior to the $SiH_4$ gas by merely 1 second. In the second step, the tungsten film 20 is filled in the via holes 17 by reducing $WF_6$ with $H_2$. In the second step, a flow rate of the $WF_6$ gas is set to 100 ml/min. (in the normal condition) and a flow rate of the $H_2$ gas is set to 1000 ml/min. (in the normal condition).

In this case, since the flow ratio of the mixed gas introduced in the first step, namely, the value of (the flow rate of the $SiH_4$ gas)/(the flow rate of the $WF_6$ gas), is set to be 1 or less, the content of silicon in the tungsten film serving as the nucleus is small at the initial stage of the film formation. Therefore, the crystallinity of the nucleus can be easily succeeded to the tungsten film grown thereon. Accordingly, the crystal orientation of the (110) plane, that is, the close-packed crystal orientation plane, of the tungsten film 20 can be improved. The half-value width of the orientation strength is found to be 4 degrees or less in the generally employed rocking curve measurement of the X-ray diffraction.

Also, since the $WF_6$ gas is introduced prior to the $SiH_4$ gas by merely 1 second in the first step in Embodiment 3, the crystal orientation of the (110) plane of the tungsten film 20 can be further improved. This is because the content of silicon in the tungsten film serving as the nucleus is further smaller at the initial stage of the film formation.

Next, as shown in FIG. 2B, the tungsten film 20, the third titanium nitride film 19 and the second titanium film 18 are subjected to the CMP, thereby removing portions of these films present on and above the silicon oxide nitrided film 16.

Then, as shown in FIG. 2c, an upper metal interconnect composed of a third titanium film 22, a fourth titanium nitride film 23, a second aluminum film 24 and a fifth titanium nitride film 25 is formed on plugs 21 and the silicon oxide nitrided film 16.

In Embodiment 3, since $SiH_4/WF_6$, that is, the mixing ratio of the gases introduced in the first step of the deposition of the tungsten film 20, is set to be 1 or less, the crystal orientation of the (110) plane, that is, the close-packed crystal orientation plane, of the tungsten film 20 can be improved, and the half-value width of the orientation strength is 4 degrees or less.

Figure 6:
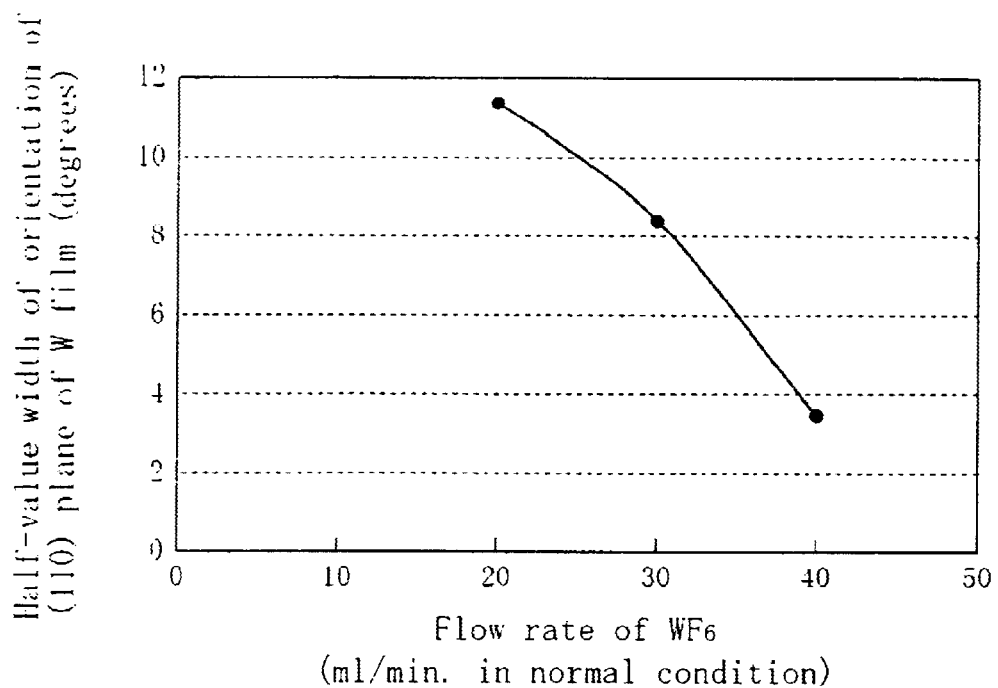
FIG. 6 is a characteristic diagram for showing the relationship between a flow rate of a $WF_6$ gas in growing a tungsten film and a half-value width of orientation strength of the (110) plane of the resultant tungsten film in the method for fabricating a semiconductor device of Embodiment 3.

FIG. 6 shows the relationship between the flow rate of the $WF_6$ gas and the half-value width of the orientation strength of the (110) plane of the tungsten film 20 obtained with the flow rate of the SiH$_4$ gas kept constant at 30 ml/min. (in the normal condition).

Figure 7:
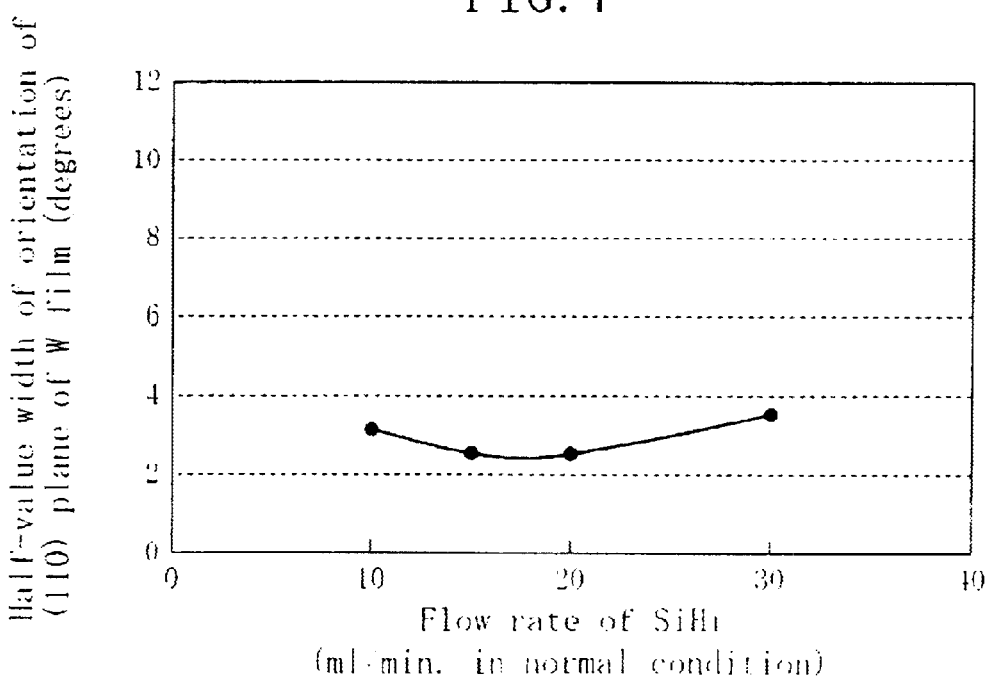
FIG. 7 is a characteristic diagram for showing the relationship between a flow rate of a $SiH_4$ gas in growing a tungsten film and a half-value width of orientation strength of the (110) plane of the resultant tungsten film in the method for fabricating a semiconductor device of Embodiment 3.
Figure 8A:
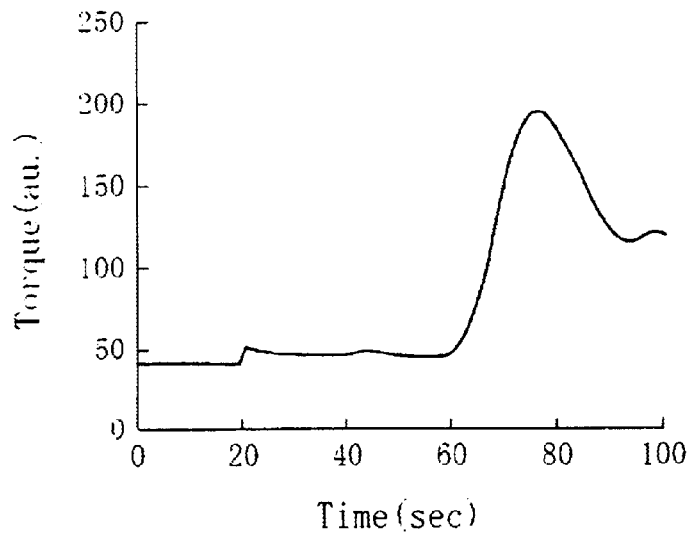
FIGS. 8A and 8B are characteristic diagrams for showing the relationship between time and rotating torque in a conventional method in which CMP is carried out on an adhesion layer deposited by CVD and a tungsten film deposited by the CVD on the adhesion layer.
Figure 8B:
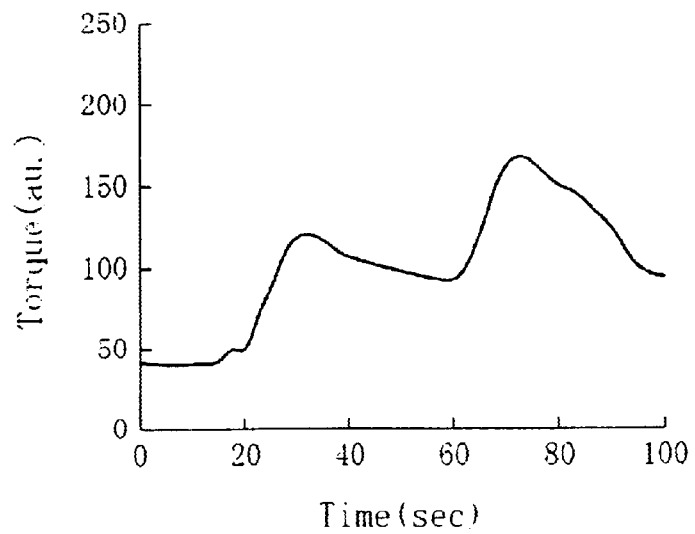

FIG. 7 shows the relationship between the flow rate of the SiH$_4$ gas and the half-value width of the orientation strength of the (110) plane of the tungsten film 20 obtained with the flow rate of the WF$_6$ gas kept constant at 40 ml/min. (in the normal condition).

Accordingly, the CMP end point of the tungsten film 20 can be accurately detected, and hence, the CMP end point of the third titanium nitride film 19 and the second titanium film 18 serving as the adhesion layer can be accurately detected. As a result, excessive polishing and insufficient polishing can be avoided.

As describe above, the crystal orientation of the (110) plane of the tungsten film 20 is improved by depositing the second titanium film 18 with a thickness of 10 nm or more by the highly directive sputtering in Embodiment 1, by forming the third titanium nitride film 19 by stacking a plurality of titanium nitride films each with a thickness of 4 nm or less formed by the LPCVD in Embodiment 2, and by setting the value of SiH$_4$/WF$_6$, that is, the mixing ratio of the gases introduced in the first step, to be 1 or less in Embodiment 3. The crystal orientation of the (110) plane of the tungsten film 20 can be further improved by combining two or more of Embodiments 1, 2 and 3.

What is claimed is:

1. A method for fabricating a semiconductor device comprising the steps of:

(a) filling a metal film in a recess formed in an insulating film deposited over a semiconductor substrate; and (b) removing a portion of said metal film present on said insulating film by CMP, so that said metal is retained in said recess, wherein said metal film is composed of a tungsten film which is oriented to a crystal plane of the (110) orientation, and wherein said step (b) includes a sub step of detecting an end point of said CMP by detecting a change of a rotation torque value in the CMP.

2. A method for fabricating a semiconductor device comprising the steps of:

(a) depositing a first metal film on an insulating film formed over a semiconductor substrate and a bottom and a wall of a recess formed in said insulating film;

(b) filling a second metal film in said recess on said first metal film; and (c) removing a portion of both said second metal film and said first metal film being present on said insulating film by CMP, so that said second metal film and said first metal film are retained in said recess, wherein said second metal film is composed of a tungsten film which is oriented to a crystal plane of(110) orientation with a half-value width of 4 degrees or less, and wherein said step (c) includes a sub step of detecting an end point of said CMP by detecting a change of a rotation torque value in the CMP.

3. The method for fabricating a semiconductor device of claim 2, wherein said first metal film includes a titanium film having a crystal plane of a (0002) orientation with a half-value of 4 degrees or less.

4. The method for fabricating a semiconductor device of claim 2, wherein said first metal film includes a lower titanium film and an upper titanium nitride film, and said lower titanium film has a thickness of 10 nm or more.

5. The method for fabricating a semiconductor device of claim 2, wherein said first metal film includes a lower titanium film and an upper titanium nitride film, said upper titanium nitride film is composed of a plurality of titanium nitride layers each having a thickness of 4 nm or less, and a plasma process is applied on said first metal film to remove carbon included in each of said plurality of titanium nitride layers.

6. The method for fabricating a semiconductor device of claim 2, wherein said first metal film includes a titanium nitride film that is found, through a 2 θ method using an in-plane x-ray diffractometer, to have a crystal plane of a (220) orientation with a half-value width of 2 degrees or less.

7. The method of fabricating a semiconductor device of claim 6, wherein said titanium nitride film includes a carbon in a concentration of 5 wt % or less.

8. The method of fabricating a semiconductor device of claim 6, wherein said titanium nitride film is formed by CVD using an organic titanium material.

9. The method for fabricating a semiconductor device of claim 2, wherein said insulating film is composed of a lower silicon oxide film doped by fluorine and an upper silicon oxide nitrided film, and said first metal film is deposited on the bottom and sidewalks of the recess formed in said insulating film, and on said upper silicon oxide nitrided film.

10. The method for fabricating a semiconductor device of claim 2, wherein the tungsten film is formed by setting the flow rate of SiH$_4$/WF$_6$, which is the mixing ratio of the gases introduced in step (b), to 1 or less.

* * * * *